United States Patent [19]

Tovar

[11] 3,790,865

[45] Feb. 5, 1974

[54] PLURALITY OF ELECTRICALLY CONNECTED SEMICONDUCTORS FORMING A HIGH VOLTAGE RECTIFIER

[75] Inventor: Theodor Tovar, Nuremberg, Germany

[73] Assignee: Semikron Gesellschaft fur Gleichrichterbau und Elektronik m.b.H., Nurnberg, Germany

[22] Filed: Aug. 2, 1971

[21] Appl. No.: 168,337

[30] Foreign Application Priority Data

July 31, 1970 Germany ........................ 2038070

[52] U.S. Cl. ...... 317/234 R, 317/234 E, 317/234 G, 317/234 W, 29/588

[51] Int. Cl. ........................ H01l 3/00, H01l 5/00

[58] Field of Search ..... 317/234, 235, 3, 3.1, 4, 4.1, 317/11; 29/588, 589

[56] References Cited

UNITED STATES PATENTS

| | | | |
|---|---|---|---|
| 3,365,794 | 1/1968 | Botka | 317/235;234 |
| 2,791,731 | 5/1957 | Walker et al. | 317/234 |
| 2,994,121 | 8/1961 | Shockley | 317/234 |
| 3,133,336 | 5/1964 | Marinace | 317/234 |
| 3,274,453 | 9/1966 | Sikina | 317/234 |
| 3,383,760 | 5/1968 | Shwartzman | 317/234 |
| 3,646,408 | 2/1972 | Kastner | 317/234 |

*Primary Examiner*—Andrew J. James
*Attorney, Agent, or Firm*—Spencer & Kaye

[57] ABSTRACT

A semiconductor high voltage rectifier including a plurality of strips of insulating material, each strip containing a plurality of openings. One of the strips contains a semiconductor wafer within each of its plurality of openings while, two of the strips contain a conducting body within each of their openings. The strips are assembled as a unit by two end caps so that the wafers are bounded on each side by a strip containing the conducting bodies. The assembly is such that the conducting bodies each engage a conducting surface of a wafer. A series circuit is established by connecting each successive pair of conducting bodies by conducting strips and the two conducting caps with the conducting bodies closest thereto by conducting strips, with the caps constituting the external terminals of the rectifier.

11 Claims, 9 Drawing Figures

PLURALITY OF ELECTRICALLY CONNECTED SEMICONDUCTORS FORMING A HIGH VOLTAGE RECTIFIER

BACKGROUND OF THE INVENTION

The present invention relates to semiconductor high voltage rectifiers, and more particularly to a semiconductor high voltage rectifier in which a number of semiconductor wafers are disposed in a supporting body of insulating material, are electrically connected by contact components and are encased in a housing.

Semiconductor high voltage rectifiers are known whose individual semiconductor devices, which are encapsulated in glass vials, are lined up on a strip of synthetic material to form a unit and this unit is then embedded in a cast synthetic tube.

It is also known to construct a high voltage rectifier unit of encapsulated individual elements which are mounted on heat dissipating sheets. The construction is made possible by the use of suitable mounting components.

It is further known to arrange encapsulated individual elements on one side of a mounting plate of a synthetic material which is provided with perforations and to bring connecting wires through the perforations and connect them on the opposite side of the plate to form an electric series circuit.

Arrangements are also known in which unencapsulated disc-type semiconductor devices are stacked in a ceramic tube and are firmly compressed and simultaneously contacted therein with the aid of helical springs disposed at both ends of the tube.

The arrangements constructed with encapsulated individual elements require a large amount of space, large amounts of material and considerable fabrication time. A stacked construction of unencapsulated individual elements generally has unfavorable heat dissipation properties and, consequently, only a slight overload resistance. Moreover, the unencapsulated individual elements present frequent difficulties in the realization of faultfree contacts.

In a further known arrangement, a number of parallel rectifier stacks of low height are clamped between two strips. Each stack of rectifiers is mounted with the aid of a compression spring and contacting as well as electrical connection of the stacks is provided by metal sheets placed therebelow. This arrangement, however, does not permit in most cases an economical operation or the attainment of the desired operating voltages.

SUMMARY OF THE INVENTION

It is, therefore, an object of the present invention to obviate the above referred to drawbacks of the known arrangements of semiconductor high voltage rectifiers and to provide a semiconductor high voltage rectifier arrangement which is surprisingly simple in construction and substantially more economical to fabricate.

This and other objects of the present invention are achieved by the provision of a semiconductor high voltage rectifier in which a supporting strip of insulating material is provided with at least one series of openings with each opening containing a semiconductor wafer. The supporting strip is assembled with a pair of contacting strips of insulating material with one on each side of the supporting strip. Each contacting strip is provided with openings which axially coincide with the wafer containing openings of the supporting strip. The contacting strips are coated along the inner wall of each opening as well as on the surface of the strips surrounding the openings with a metal layer forming a conducting body. Each conducting body contacts one side of a respective semiconductor wafer. Separate metallic conducting strips are provided which engage two successive conducting bodies to produce thereby a series circuit with the semiconductor wafers. The supporting and contacting strips are assembled by two conducting caps. The conducting caps connect corresponding ends of supporting and contacting strips. Each cap is connected to the appropriate conducting body closest thereto by a conducting strip so that the caps constitute the external terminals of the rectifier. All contact points of the assembly are soldered and the resulting assembly is enclosed in a housing.

DESCRIPTION OF THE PREFERRED EMBODIMENTS

Figure 1A:
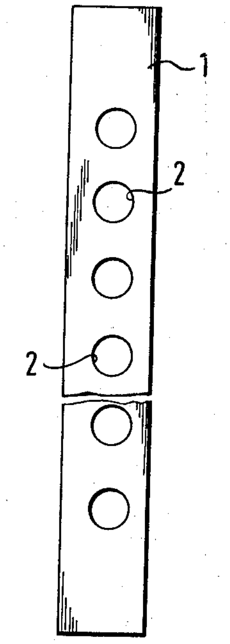
FIG. 1*a* is a plan view of the supporting strip of the present invention showing one arrangement of openings therein.
Figure 1B:
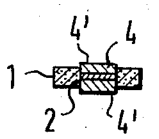
FIG. 1*b* is a cross-sectional end view through one of the openings of the supporting strip and showing a semiconductor wafer inserted therein.

The strip-shaped supporting body 1 of insulating material shown in FIGS. 1*a* and 1*b*, which has, for example, a rectangular cross section, is provided with circular openings 2 arranged along the longitudinal axis thereof for holding therein a number of semiconductor wafers 4 arranged to form a series connected rectifier. The semiconductor wafers 4 preferably consist of semiconductor discs having contacting layers 4′ fastened to both its sides. The required insulating distance between respective adjacent contacting layers 4′ of successive semiconductor wafers 4, which are at different potentials, is the decisive factor for the mutual spacing of the openings 2. The area of the openings 2 is adapted to that of the semiconductor wafers 4 so that the semiconductor wafers, which are covered, for example, with a protective lacquer over their jacket surfaces, can be inserted in a close fitting member.

The length of the supporting body 1 depends on the required distance between successive openings and the intended number of openings 2. Its thickness is determined by the thickness of the semiconductor wafers employed, as well as by fabrication requirements.

The supporting body 1 consists of electrical insulating material, for example, ceramic or plastic. The material is selected with regard to its thermal behavior, its leakage current resistance and its voltage load capability. When ceramics are employed an oxide ceramic has been found to be advantageous. Among the plastics, epoxy resins or melamine resisns are particularly applicable. The latter may also be glass fiber reinforced to improve their electrical and thermal properties. Furthermore, the plastic may also be covered with a lacquer to increase its leakage current resistance and may additionally be provided with a transverse groove or rib between adjacent recesses.

In FIG. 1*b*, the semiconductor wafer 4 which is inserted in one of the openings 2 of the supporting body 1, so that the wafer protrudes on both sides, is preferably assembled to fit tightly in its opening. The tight fit is sufficient to hold the wafer when it is contacted so that the contact layers 4' of adjacent semiconductor wafers to be connected together can advantageously be electrically connected in series by a deposited conductive strip.

Figure 2A:
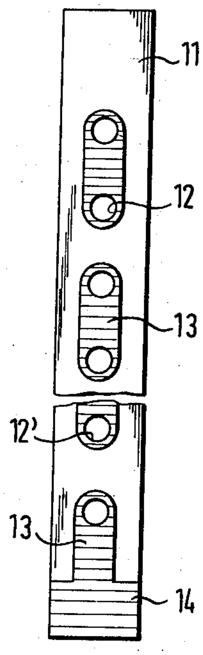
FIG. 2*a* is a plan view of a contacting strip of the present invention showing an arrangement of openings containing a conducting body therein and conducting strips between the conducting bodies including a conducting strip extending to one edge thereof.

In order to connect the wafers in series, a contact strip 11 shown in FIG. 2*a* is provided. The contacting strip 11 has openings 12 whose area is preferably smaller than that of the openings 2 of the supporting body 1. The openings 12 correspond in number and arrangement with the openings 2 in the supporting body 1 when the supporting body 1 and the contacting strip 11 are congruently assembled together. Along the wall of the openings 12 and on the surfaces of the strip 11 surrounding the openings 12, the contacting strip 11 is coated with a metal layer 12' in the manner used to form the laminations of conductor foils for printed circuits, for example. The contacting strip 11 is also provided with a deposited conductive strip 14 at one end of its side to produce an outer line connection for the series circuit and a deposited conductive strip 13 which extends from conductive strip 14 to the adjacent first opening 12. To produce a series connection of two adjacent semiconductor wafers the conductive layers 12' of the associated openings 12 are connected together by conductive strips 13. The expanse of the conductive layers 12' surrounding the openings 12 approximately corresponds to the circumferences of the associated semiconductor wafers 4. The thickness of the conductive strips 13, which consist of an easily solderable material, preferably copper, is not critical since they are additionally provided with a solder layer when the semiconductor wafers 4 are immersion soldered to produce contacting and electrical connections.

The contacting strip 11 may also be of ceramic, but is preferably made of plastic, particularly of a material which can be used to produce conductor plates.

Figure 2B:
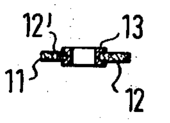
FIG. 2*b* is a cross-sectional end view through one of the openings of the contacting strip showing the extent of the conducting body.

FIG. 2*b* is a sectional view of the contacting strip 11 through one of the openings 12. Each conducting layer 12' on one side of the contacting strip 11 extends along the inner surface of its associated opening 12 to the other side thereof. This leaves an opening smaller than the end surface area of the semiconductor wafers 4 which constitutes a channel for solder material to reach the contacting area of the respective semiconductor wafer 4 when the unit is solder-contacted, preferably by immersion in a solder bath.

Figure 3:
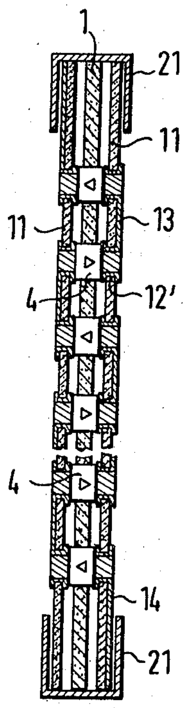
FIg. 3 is a cross-sectional view of one possible assembly of the components of the present invention, with the central part of the assembly broken away.

FIG. 3 shows a supporting body 1 of insulating material and contacting strips 11 disposed at both its sides. The supporting body 1 and the contacting strips 11 can have any desired length. Semiconductor wafers 4 are inserted into the supporting body 1 with alternatingly different electrical polarity orientations, the polarity of each being indicated by an arrow head on each wafer. The contacting strips 11 on both sides of the supporting body 1 have an area which is substantially equal to that of the supporting body 1. The conductive strips 13 of the strips 11 are disposed on the side thereof facing away from the supporting body 1. The conductive layers 12' of the openings 12 are in surface contact with the contact layers 4' of the semiconductor wafers 4 such that the centers of openings 2 and 12 are aligned.

The embodiment shown in FIG. 2*a* is of the contacting strip 11 disposed on the right side of the supporting body 1 shown in FIG. 3. The configuration of the contacting strips 11 and the arrangement of the conducting strip 14 and conductive strips 13 depend on the number and arrangement of the semiconductor wafers 4.

With an odd number of wafers, both contacting strips 11 have the same configuration and are arranged in mirror-symmetry with respect to the transverse axis of the supporting body 1. In this case, for example, the conducting layer 14 of the contacting strip 11 disposed on the right side of the supporting body 1 forms the first external line connection of the series circuit and the conducting layer 14 at the opposite end of the contacting strip 11 disposed on the left side of the supporting body 1 forms the other external line connection. The interchangeability of the sides of the contacting strips 11 provided with such an arrangement constitutes a further advantage of the present invention.

With an even number of simiconductor wafers 4, however, one of the two contacting strips 11 has a conducting strip 14 at each end and conductive strips 13 therebetween, while the other contacting strip 11 is provided only with conductive strips 13.

A conducting member or contacting piece 21 which has, for example, a U-shaped or a cup shape is placed over the end sections of the extended structure according to FIG. 3. The contacting piece 21 suitably clamps together the supporting body 1 and the contacting strips 11 for the performance of the soldering process. Also, in the finished arrangement, the contacting piece 21 connects one terminal of the series circuit with a metallic component at the associated end of the housing 20. The ends of the arms of the contacting piece 21 may be bent outwardly to facilitate its placement.

The contacting strips 11 may also be so designed and arranged that the conductive strips 13 are disposed on the side thereof facing the supporting body 1 with the conducting strip 14 lying on the side away from the supporting body. Moreover, the contacting strips 11 may be so designed that filling of the openings 12 with solder metal provides pin-type contact parts which rest on the contacting layers 12' of the semiconductor wafers 4. A solderable coating on the semiconductor wafers 4 and on the contacting layers assures a permanent connection at all contact points of the structure when the structure formed of the supporting body and the contacting strips is subjected to a heat treatment.

Figure 4:
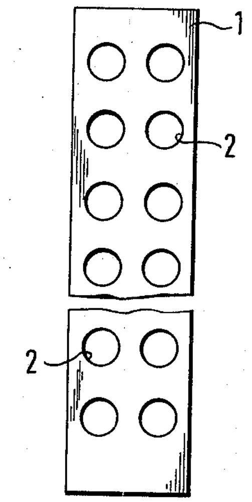
FIGS. 4 and 5 are plan views of the supporting strip of the present invention showing other arrangements of the openings therein.
Figure 5:
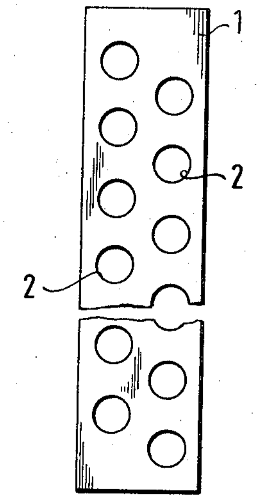

Advantageous further embodiments of the present invention consist in that the openings 2 of the supporting body 1 are arranged in a patterned array of rows which are axially aligned as shown in FIG. 4 or offset as shown in FIG. 5. It should be understood, however, that other patterned arrays may be utilized as desired. The contacting strips 11 are correspondingly configured with regard to openings 12 so that they are adapted to the arrangement of the openings 2.

Figure 6:
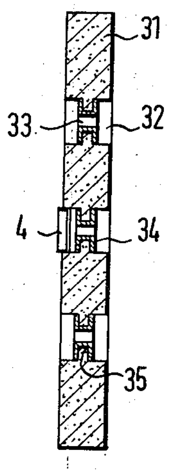
FIG. 6 is a sectional view of another embodiment of the supporting strip of the present invention showing still another arrangement of openings therein.

Another embodiment shown in FIG. 6 consists of a supporting strip 31 of insulating material which is provided with recesses 32 on opposite sides thereof in such a manner that one recess from one side and the oppositely disposed recess on the other side serve to provide a spatial and electrical series connection of two semiconductor wafers 4. The recesses 32 are connected together via a bore 33. To fasten the semiconductor wafers 4 and to conductively connect them together, the bottom walls of the recesses 32 and the wall of the bores 33 are provided with a continuous metal layer coating which forms a conducting layer 34 and 35. The outer contact surfaces of two adjacent semiconductor wafers 4 on the same side of the supporting body 31 are contacted and connected, according to the present invention, with the aid of a contacting strip placed thereagainst in a manner similar to that described above.

For the accurate mutual association of the strip-shaped components, the same markings notches, for example, may be provided at coinciding edges of the various strips.

The present invention also permits, in a simple manner, the design of high voltage rectifiers in any desired mode of connection. To produce a three-phase star connection, the supporting body 1 may be provided with three parallel rows of openings 2 or 32. Accordingly, each side of the supporting body 1 may be covered with one or three correspondingly designed contacting strips 11 so that three independent series circuits are provided which can suitably be electrically connected together.

To produce rectifier arrangements according to the present invention, a supporting body 1 is supplied with semiconductor wafers 4. Thereafter, a suitably designed contacting strip 11 is placed in area contact with each side of the supporting body 1 in such a manner that the conducting layers 12′ of the openings 12 engage the contacting layers 4′ of the associated semiconductor wafers 4. The components which are stacked into a strip-shaped configuration are held together at each end by the application of a contact piece 21. Immersion of the structure in a solder bath simultaneously contacts all of the semiconductor wafers 4 with their associated conductive strips 13 and permanently connects them with the contact piece 21. After electrical testing, the structure according to the present invention is encapsulated in a known manner.

Economical manufacture is realized by the present invention in that the supporting bodies of insulating material and the contacting strips are prefabricated in longer lengths and are provided with coinciding markers for separation along their lengths. They are then assembled and contacted in the above-described manner and then divided into the structural length required for the desired circuit.

Figure 7:
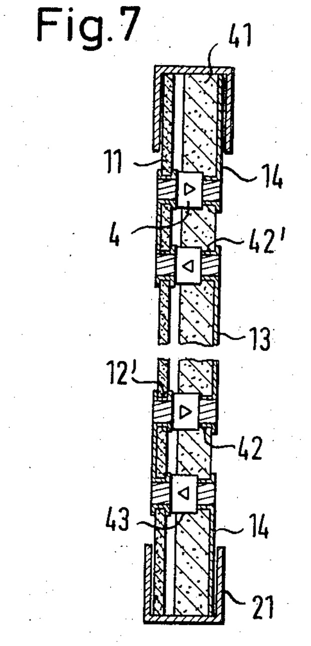
FIG. 7 is a sectional view of another embodiment of the present invention wherein a conducting strip serves simultaneously as a carrier of the semiconductor wafers.

A further advantageous embodiment of the present invention is so designed that one of the two contacting strips 11 simultaneously serves as the supporting body of the semi-conductor wafers with the openings of the contacting strip serving to hold the semiconductor wafers therein. Both contacting strips, when connected via suitably inserted semi-conductor wafers, form a high voltage rectifier according to the present invention. In FIG. 7 such an embodiment is shown in sectional view. For insertion of semiconductor wafers 4*a* supporting body 41 is provided. On one side the body 41 has openings 43 which extend into the body 41 and communicate with smaller, coaxially arranged openings 42′ extending to the other side of the body 41. These smaller diameter openings carry conductive layers 42 for contacting one side of the semiconductor wafers 4. According to the provided series circuit two consecutive openings, each, are connected via a conductive strip 13. The contacting of the other side of the semiconductor wafers 4 is provided by means of contacting layers 12 via a contacting strip 11 in a manner similar to that explained with respect to the embodiment of FIG. 3. Moreover, the description presented in connection with the embodiment of FIG. 3 regarding the contact strip 14 and the contact piece 21 are applicable to the embodiment of FIG. 7.

It will be understood that the above description of the present invention is susceptible to various modifications, changes and adaptations, and the same are intended to be comprehended within the meaning and range of the equivalents of the appended claims.

I claim:

1. A semiconductor high voltage rectifier, comprising, in combination:

a. a plurality of individually formed semiconductor wafers;

b. a supporting strip of insulating material including a plurality of openings into each of which is inserted a respective one of said plurality of wafers, each of said openings being composed of two portions each extending partially into said supporting strip from a respective surface thereof and a bore extending between, and communicating with, said portions, said supporting strip further including a plurality of additional conducting bodies each disposed within a respective one of said bores and extending partially into each of said opening portions communicating with its respective bore;

c. a pair of contacting strips of insulating material one on each side of said supporting strip, each of said strips including a plurality of openings therein which are in axial alignment with the plurality of openings in said supporting strip;

d. a plurality of conducting bodies each disposed within a respective one of said plurality of openings of said contacting strips and each contacting a respective one of said plurality of wafers;

e. a plurality of conducting strips on one side of said contacting strips each engaging two successive conducting bodies to produce thereby a series circuit with said plurality of wafers;

f. a pair of conducting caps each connecting corresponding ends of said supporting strip and said contacting strips; and g. a pair of further conducting strips each contacting a respective one of said conducting caps and a respective one of said conducting bodies, whereby said caps constitute the external terminals of said rectifier.

2. A semiconductor high voltage rectifier as defined in claim 1, wherein said conducting caps are U-shaped.

3. A semiconductor high voltage rectifier as defined in claim 1, wherein said conducting caps are cup-shaped.

4. A semiconductor high voltage rectifier as defined in claim 1, wherein each of said strips of insulating material includes an even number of openings and said pair of further conducting strips are on one side of said supporting strip.

5. A semiconductor high voltage rectifier as defined in claim 1, wherein each of said strips of insulating material includes an odd number of openings and said pair of further conducting strips are disposed on respectively opposite sides of said supporting strip.

6. A semiconductor high voltage rectifier as defined in claim 1, wherein the plurality of openings in said supporting strip and said contacting strips form superposed patterned arrays.

7. A semiconductor high voltage rectifier as defined in claim 6, wherein the patterned arrays each include at least one row of said openings.

8. A semiconductor high voltage rectifier as defined in claim 6, wherein the patterned arrays each include a plurality of spaced parallel rows of said openings and wherein corresponding openings in each row are axially aligned.

9. A semiconductor high voltage rectifier as defined in claim 6, wherein the patterned arrays each include a plurality of spaced parallel rows of said openings and wherein corresponding openings in each row are offset axially.

10. A semiconductor high voltage rectifier, comprising, in combination:

a. a plurality of individually formed semiconductor wafers;

b. a pair of contacting strips of insulating material, each of said strips including a plurality of openings therein, with the openings of one strip each having inserted therein a respective one of said plurality of wafers;

c. a plurality of conducting bodies each disposed within a respective one of said openings of said other contacting strip and each contacting a respective one of said plurality of wafers;

d. a plurality of conducting strips with a portion thereof each engaging two successive conducting bodies and another portion thereof each engaging two successive ones of said plurality of wafers to produce thereby a series circuit with said plurality of wafers;

e. a pair of conducting caps each connecting corresponding ends of said contacting strips; and f. a pair of further conducting strips each contacting a respective one of said conducting caps and a respective end of said series circuit.

11. A semiconductor high voltage rectifier, comprising, in combination:

a. a plurality of individually formed semiconductor wafers;

b. a supporting strip of insulating material including a plurality of openings into each of which is inserted a respective one of said plurality of wafers;

c. a pair of contacting strips of insulating material one on each side of said supporting strip, each of said strips including a plurality of openings therein which are in axial alignment with the plurality of openings in said supporting strip;

d. a plurality of conducting bodies each disposed within a respective one of said plurality of openings of said contacting strips and each contacting a respective one of said plurality of wafers;

e. a plurality of conducting strips on one side of said contacting strips each engaging two successive conducting bodies to produce thereby a series circuit with said plurality of wafers;

f. a pair of conducting caps each connecting corresponding ends of said supporting strip and said contacting strips; and g. a pair of further conducting strips each contacting a respective one of said conducting caps and a respective one of said conducting bodies, whereby said caps constitute the external terminals of said rectifier; and h. wherein the plurality of openings in said supporting strip and said contacting strips form superposed patterned arrays constituted by a plurality of spaced parallel rows of said openings with corresponding openings in each row being offset axially.

* * * * *